(12) United States Patent
Furlani et al.

(10) Patent No.: US 6,262,519 B1
(45) Date of Patent: *Jul. 17, 2001

(54) METHOD OF CONTROLLING FLUID FLOW IN A MICROFLUIDIC PROCESS

(75) Inventors: Edward P. Furlani, Lancaster; Syamal K. Ghosh; Dilip K. Chatterjee, both of Rochester, all of NY (US)

(73) Assignee: Eastman Kodak Company, Rochester, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/100,565

(22) Filed: Jun. 19, 1998

(51) Int. Cl.[7] .................................................. H01L 41/08

(52) U.S. Cl. ......................... 310/358; 310/330; 310/332

(58) Field of Search ........................... 310/328, 330–332, 310/357–359; 417/413.2

(56) References Cited

U.S. PATENT DOCUMENTS

| | | | |
|---|---|---|---|
| 2,928,409 | * | 3/1960 | Johnson et al. .................. 310/332 X |
| 4,356,424 | * | 10/1982 | Marcus ................................. 310/357 |
| 4,375,042 | * | 2/1983 | Marcus ................................. 310/357 |
| 4,939,405 | * | 7/1990 | Okuyama et al. ............... 310/332 X |
| 5,589,725 | * | 12/1996 | Haertling ............................ 310/358 |

* cited by examiner

*Primary Examiner*—Mark O. Budd
(74) *Attorney, Agent, or Firm*—Clyde E. Bailey, Sr.

(57) ABSTRACT

A method of controlling fluid flow in a microfluidic process includes the step of providing a piezoelectric pumping apparatus (100) in fluid communications with the microfluidic process such as an ink jet printer and the like. The piezoelectric pumping apparatus (100) has a piezoelectric transducer (80) with a functionally gradient piezoelectric element (60) arranged in a fluid containment chamber (120) which fluidically communicates with the microfluidic process. The functionally gradient piezoelectric element (60) responds to a voltage applied by a power source (240) by either expanding to expel fluid from the microfluidic process or contracting to permit fluid to enter the fluid containment chamber (120) and thus the microfluidic process.

4 Claims, 4 Drawing Sheets

METHOD OF CONTROLLING FLUID FLOW IN A MICROFLUIDIC PROCESS

CROSS REFERENCE TO RELATED APPLICATIONS

This application is related to commonly owned U.S. application Ser. No. 09/071,485, filed May 1, 1998, entitled CONTROLLED COMPOSITION AND CRYSTALLOGRAPHIC CHANGES IN FORMING FUNCTIONALLY GRADIENT PIEZOELECTRIC TRANSDUCERS, by Dilip K. Chatterjee, Syamal K. Ghosh, and Edward P. Furlani.

FIELD OF THE INVENTION

The invention relates generally to the field of fluid flow control. More particularly, the invention concerns fluid flow in a microfluidic process, such as an ink jet printer and the like, that requires high reliability and accurate fluid flow control.

BACKGROUND OF THE INVENTION

Piezoelectric pumping mechanisms are used in a wide range of microfluidic applications ranging from the controlled metering and flow of intravenous solutions in biomedical environments to ink jet printing apparatus. Conventional piezoelectric pumps utilize piezoelectric transducers that comprise one or more uniformly polarized piezoelectric elements with attached surface electrodes. The three most common transducer configurations are multilayer ceramic, monomorph or bimorphs, and flextensional composite transducers. To activate a transducer, a voltage is applied across its electrodes thereby creating an electric field throughout the piezoelectric elements. This field induces a change in the geometry of the piezoelectric elements resulting in elongation, contraction, shear or combinations thereof. The induced geometric distortion of the elements can be used to implement motion or perform work. In particular, piezoelectric bimorph transducers, which produces a bending motion, are commonly used in micropumping devices. However, a drawback of the conventional piezoelectric bimorph transducers is that two bonded piezoelectric elements are needed to implement the bending. These bimorph transducers are difficult and costly to manufacture for micropumping applications (in this application, the word micro means that the dimensions of the apparatus range from 100 microns to 10 mm). Also, when multiple bonded elements are used, stress induced in the elements due to their constrained motion can damage or fracture an element due to abrupt changes in material properties and strain at material interfaces.

Therefore, a need persists for a piezoelectric pumping apparatus that utilizes a functionally gradient piezoelectric transducer that overcomes the aforementioned problems associated with conventional pumping apparatus.

SUMMARY OF THE INVENTION

It is, therefore, an object of the present invention to provide a method of controlling fluid flow in a microfluidic process which includes a piezoelectric pump that utilizes a functionally gradient transducer in which the pumping action is accomplished with a single functionally gradient piezoelectric element.

It is a feature of the method of the invention that a functionally gradient piezoelectric transducer in fluid communications with the microfluidic process expands to expel fluid from the microfluidic process and contracts to cause fluid to enter the microfluidic process.

To accomplish these and other objects of the invention, there is provided, in one aspect of the invention, a method of controlling fluid flow in a microfluidic process comprising the step of providing a piezoelectric pump in fluid communications with the microfluidic process. The piezoelectric pump comprises a pump body having a fluid containment chamber and inlet and outlet ports in fluid communication with the fluid containment chamber. The inlet and outlet ports have, respectively, a first valve and a second valve for controlling fluids passing therethrough and through the microfluidic process. A piezoelectric transducer is arranged in the pump body.

The piezoelectric transducer includes a functionally gradient piezoelectric element having first and second surfaces and is formed of piezoelectric material having a functionally gradient d-coefficient selected so that the functionally gradient piezoelectric element changes geometry in response to an applied voltage. When the voltage is applied, an electric field is produced in the functionally gradient piezoelectric element. More particularly, first and second electrodes respectively disposed over the first and second surfaces of the functionally gradient piezoelectric element are arranged so that voltage applied to the first and second electrodes induces the electric field in the functionally gradient piezoelectric element.

A source of power having first and second terminals connected to the first and second electrodes, respectively, of the piezoelectric transducer enables fluid flow through the fluid containment chamber which is in fluid communications with the microfluidic process. Thus, on the one hand, when the piezoelectric transducer is energized to pump fluid out of the fluid containment chamber and thus into the microfluidic process, the source of power provides a positive voltage to the first terminal and a negative voltage to the second terminal. On the other hand, when the piezoelectric transducer is energized to pump fluid into the fluid containment chamber, and thus out of the microfluidic process, the source of power provides a negative voltage to the first terminal and a positive voltage to the second terminal.

Accordingly, the method of piezoelectric pumping apparatus of the invention has numerous advantages over prior art developments, including: it enables the use of a single functionally gradient piezoelectric element to implement a desired geometric distortion thereby eliminating the need for multilayered or composite piezoelectric structures; it eliminates the need for multiple electrodes and associated drive electronics; and it minimizes or eliminates stress induced fracturing that occurs in multilayered or composite piezoelectric structures.

BRIEF DESCRIPTION OF THE DRAWINGS

The above and objects, features and advantages of the present invention will become apparent when taken in conjunction with the following description and drawings wherein identical reference numerals have been used, where possible, to designate identical features that are common to the figures, and wherein.

DETAILED DESCRIPTION OF THE INVENTION

Figure 1:
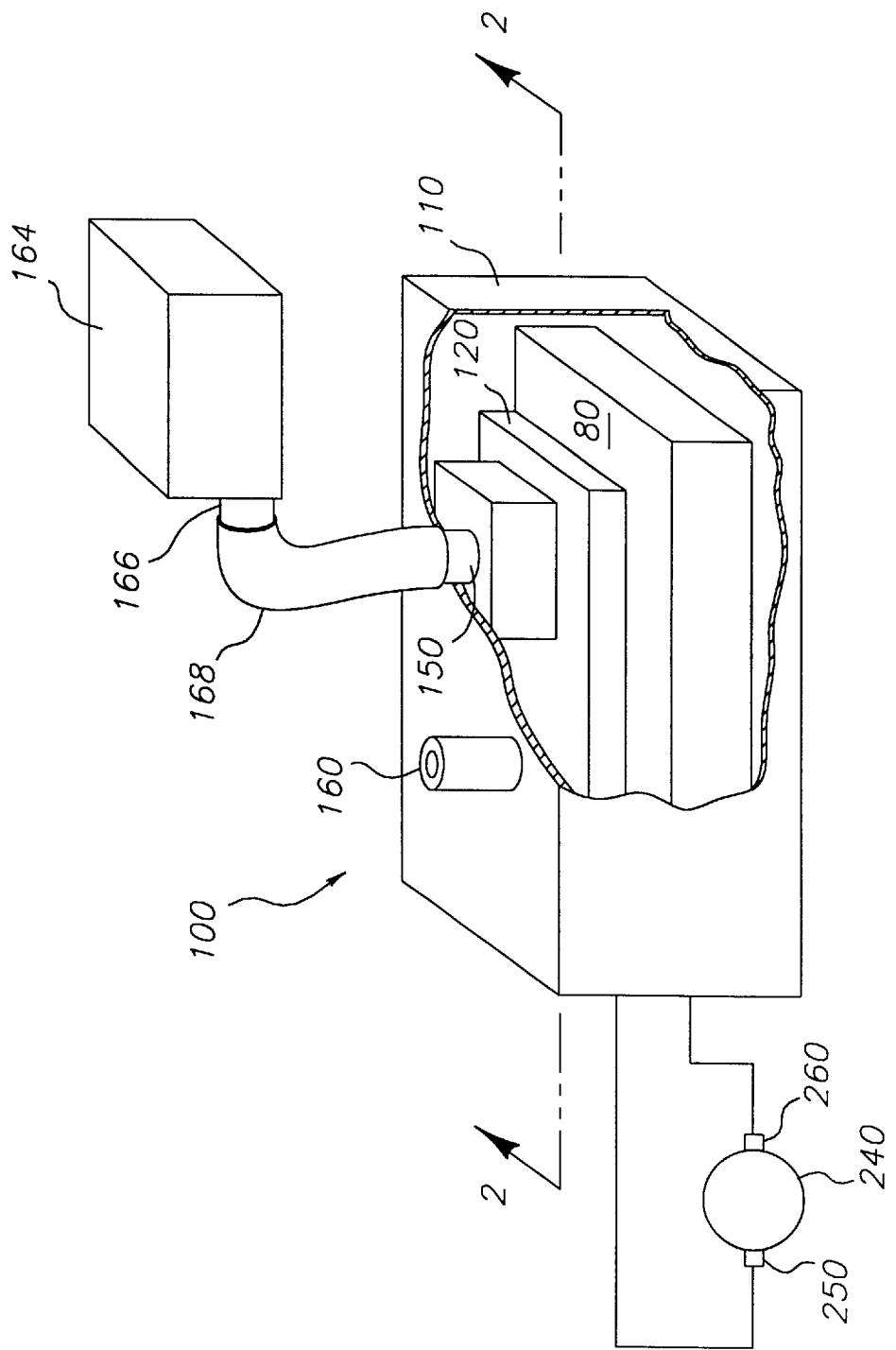
FIG. 1 is a perspective view of the piezoelectric pumping apparatus of the invention, partially torn away to expose the piezoelectric transducer.
Figure 2:
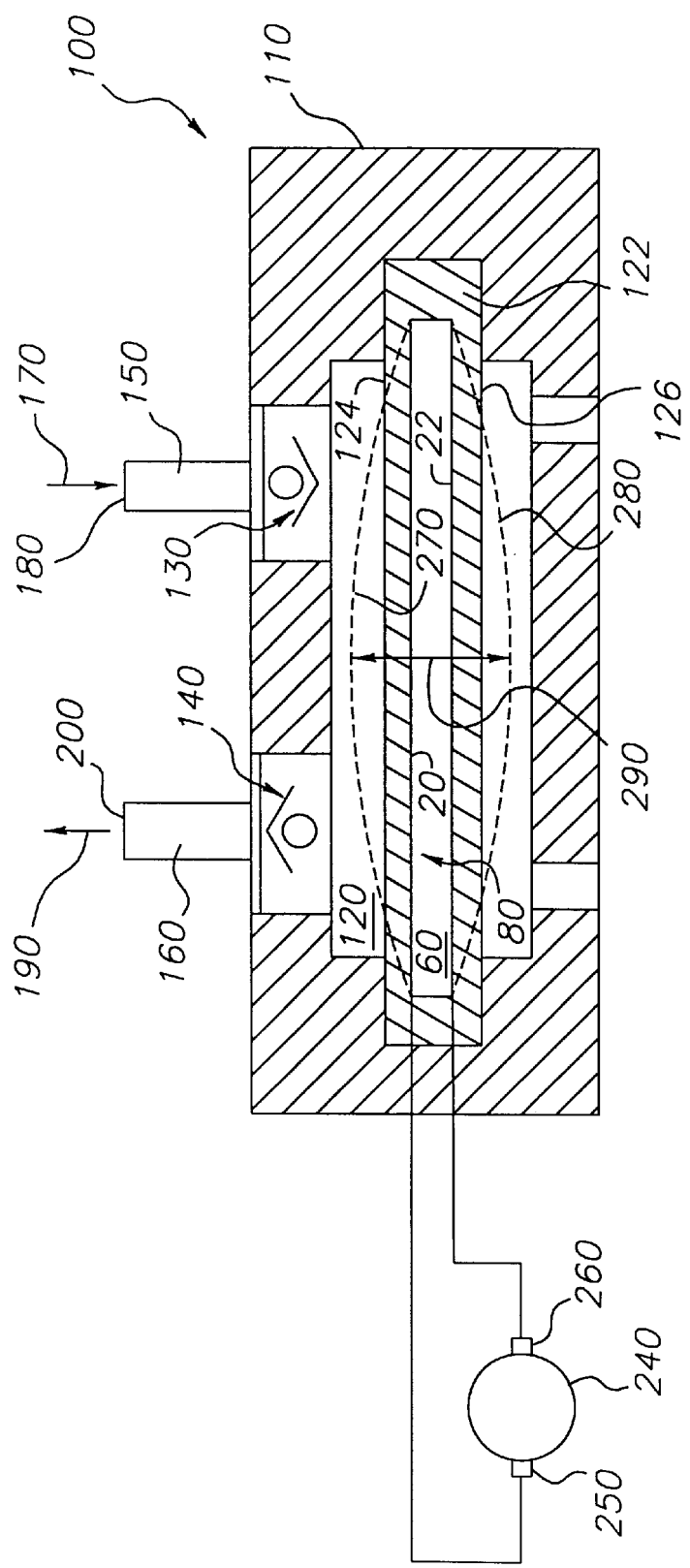
FIG. 2 is a section view along line 2—2 of FIG. 1.

Turning now to the drawings, and particularly to FIGS. 1 and 2, the piezoelectric pumping apparatus 100 of the present invention is illustrated. As depicted in FIGS. 1 and 2, piezoelectric pumping apparatus 100 comprises a pump body 110 having a fluid containment chamber 120 and an inlet port 150 and outlet port 160 in fluid communication with the fluid containment chamber 120. The inlet and outlet ports 150, 160 have, respectively, a first valve 130 and a second value 140 for controlling fluids passing therethrough and through the fluid containment chamber 120. As seen clearly in FIG. 1, piezoelectric transducer 80 is arranged in the pump body 110 for enabling fluid flow in and out of the fluid containment chamber 120, as described in detail below. A reservoir 164 has an outflow port 166 which is connected via a fluid conduit 168 to inlet port 150 for supplying fluid to the piezoelectric pump 100.

Figure 3:
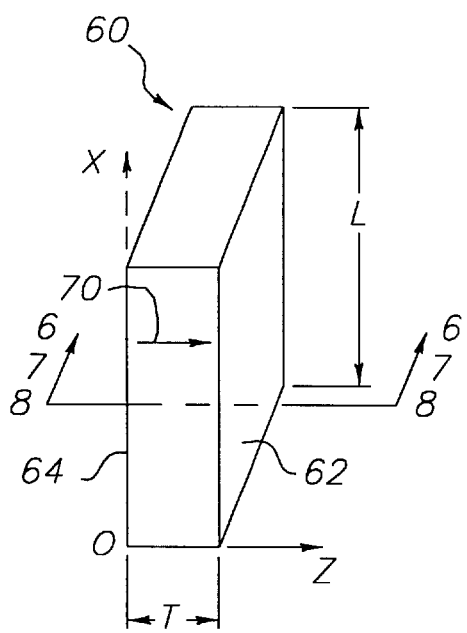
FIG. 3 is a perspective view of a functionally gradient piezoelectric element with a functionally gradient $d_{31}$ coefficient.

Referring to FIG. 3, a perspective view is shown of a functionally gradient piezoelectric element 60 with a functionally gradient $d_{31}$ coefficient. A functionally gradient piezoelectric element 60 has first and second surfaces 62 and 64, respectively. The width of the functionally gradient piezoelectric element 60 is denoted by T and runs perpendicular to the first and second surfaces 62 and 64, respectively, as shown. The length of the functionally gradient piezoelectric element 60 is denoted by L and runs parallel to the first and second surfaces 62 and 64, respectively, as shown. A functionally gradient piezoelectric element 60 is poled perpendicularly to the first and second surfaces 62 and 64 as indicated by polarization vector 70.

Figure 4:
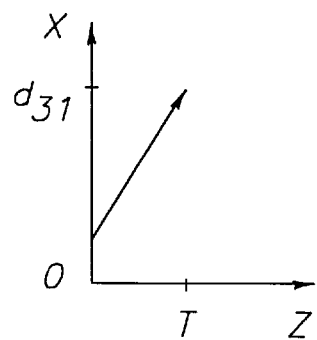
FIG. 4 is a plot of the piezoelectric $d_{31}$ coefficient across the width (T) of a piezoelectric transducer element of FIG. 3.
Figure 5:
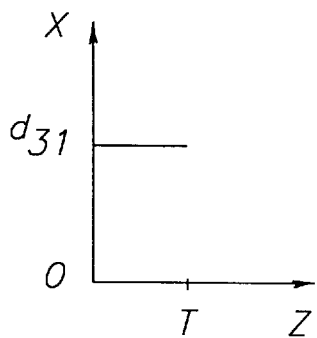
FIG. 5 is a plot of piezoelectric $d_{31}$ coefficient across the width (T) of a conventional piezoelectric bimorph transducer element, respectively.

Skilled artisans will appreciate that in conventional piezoelectric transducers the piezoelectric "d"-coefficients are constant throughout the piezoelectric element 60. Moreover, the magnitude of the induced sheer and strain are related to these "d"-coefficients via the constitutive relation as is well known. However, the functionally gradient piezoelectric element 60 used in the pumping apparatus 100 of the invention is fabricated in a novel manner so that its piezoelectric properties vary in a prescribed fashion across its width as described below. The $d_{31}$ coefficient varies along a first direction perpendicular to the first surface 62 and the second surface 62, and decreases from the first surface 64 to the second surface 64, as shown in FIG. 4. This is in contrast to the uniform or constant spatial dependency of the $d_{31}$ coefficient in conventional piezoelectric elements, illustrated in FIG. 5.

In order to form the preferred functionally gradient piezoelectric element 60 having a piezoelectric $d_{31}$ coefficient that varies in this fashion, the following method may be used. A piezoelectric block is coated with a first layer of piezoelectric material with a different composition than the block onto a surface of the block. Sequential coatings of one or more layers of piezoelectric material are then formed on the first layer and subsequent layers with different compositions of piezoelectric material. In this way, the functionally gradient piezoelectric element 60 is formed having a functionally gradient composition which varies across the width of the functionally gradient piezoelectric element 60, as shown in FIG. 4.

Preferably, the piezoelectric materials used for forming the functionally gradient piezoelectric element 60 are selected from the group consisting of PZT, PLZT, $LiNbO_3$, $LiTaO_3$, $KNbO_3$ or $BaTiO_3$. Most preferred in this group is PZT. For a more detailed description of the method, see cross-referenced commonly assigned U.S. patent application Ser. No. 09/071,485, filed May 1, 1998, to Chatterjee et al, hereby incorporated herein by reference.

Figure 6:
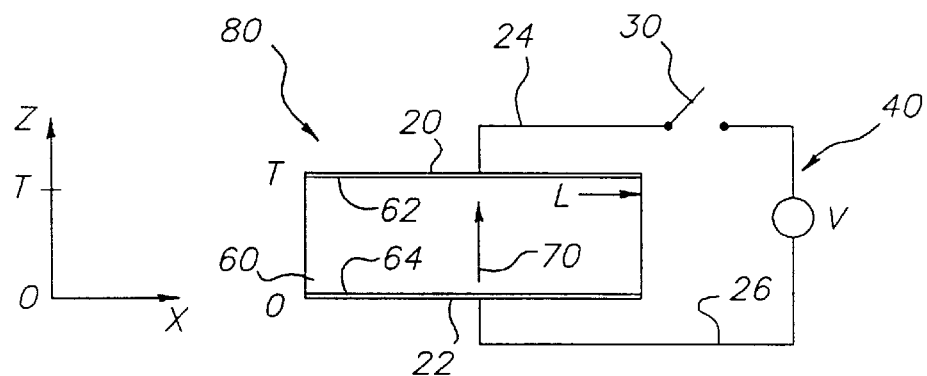
FIG. 6 is a section view along line 6—6 of FIG. 3 illustrating the piezoelectric transducer before activation.
Figure 7:
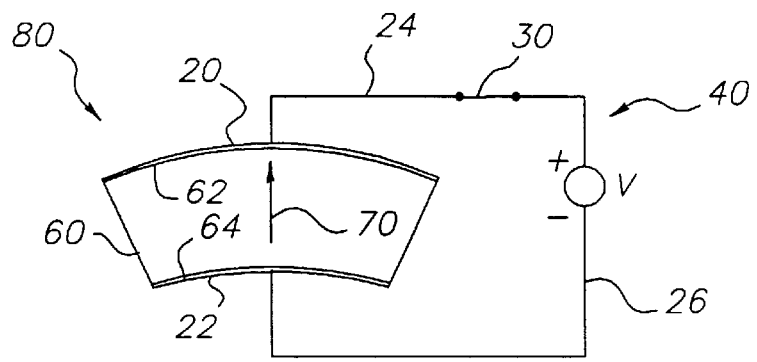
FIG. 7 is a section view taken along line 7—7 of FIG. 3 illustrating the piezoelectric transducer after activation.
Figure 8:
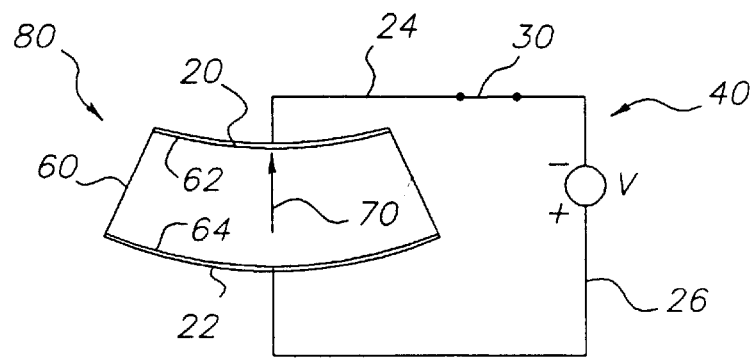
FIG. 8 is a section view taken along line 8—8 of FIG. 3 illustrating the piezoelectric transducer after activation but under a opposite polarity compared to FIG. 7.

Referring now to FIGS. 6–8, the piezoelectric transducer 80 is illustrated comprising functionally gradient piezoelectric element 60 in the inactivated state, a first bending state, and a second bending state, respectively. The word bending includes elongation, contraction, shear, or combinations thereof. Piezoelectric transducer 80 comprises a functionally gradient piezoelectric element 60, with polarization vector 70, and first and second surface electrodes 20 and 22 attached to first and second surfaces 62 and 64, respectively. First and second surface electrodes 62 and 64 are connected to wires 24 and 26, respectively. Wire 24 is connected to a switch 30 that, in turn, is connected to a first terminal of voltage source 40. Wire 26 is connected to the second terminal of voltage source 40 as shown.

According to FIG. 6, the transducer 80 is shown with switch 30 open. Thus there is no voltage across the transducer 80 and it remains unactivated.

According to FIG. 7, the transducer 80 is shown with switch 30 closed. In this case, the voltage V of voltage source 40 is impressed across the transducer 80 with positive and negative terminals of the voltage source 40 electrically connected to the first and second surface electrodes 20 and 22, respectively. Thus, the first surface electrode 20 is at a higher potential than the second surface electrode 22. This potential difference creates an electric field through the functionally gradient piezoelectric element 60 causing it to expand in length parallel to its first and second surfaces 62 and 64, respectively and perpendicular to polarization vector 70. Specifically, we define S(z) to be the change in length (in this case expansion) in the x (parallel or lateral) direction noting that this expansion varies as a function of z. The thickness of the functionally gradient piezoelectric element 60 is given by T as shown, and therefore $S(z)=(d_{31}(z)V/T) \times L$ as is well known. The functional dependence of the piezoelectric coefficient $d_{31}(z)$ increases with z as shown in FIG. 4. Thus, the lateral expansion S(z) of the functionally gradient piezoelectric element 60 decreases in magnitude from the first surface 62 to the second surface 64. Therefore, when a potential difference is impressed across the transducer 80 with the first surface electrode 20 at a higher potential than the second surface electrode 22, the transducer 80 distorts into a first bending state as shown. The word bending includes elongation, contraction, shear, or combinations thereof.

Referring to FIG. 8, the transducer 80 is also shown with switch 30 closed. In this case, the voltage (V) of voltage source 40 is impressed across the transducer 80 with the negative and positive terminals of the voltage source 40 electrically connected to the first and second surface electrodes 20 and 22, respectively. Thus, the first surface electrode 20 is at a lower potential than the second surface electrode 22. As before, this potential difference creates an electric field through the functionally gradient piezoelectric element 60 causing it to contract in length parallel to its first and second surfaces 62 and 64, respectively and perpendicular to polarization vector 70. Specifically the change in length (in this case contraction) is given by $S(z)=(d_{31}(z)V/T)\times L$ as is well known. Since the functional dependence of the piezoelectric coefficient $d_{31}(z)$ increases with z as shown in FIG. 4, the lateral contraction $S(z)$ of the functionally gradient piezoelectric element 60 decreases in magnitude from the first surface 62 to the second surface 64. Therefore, when a potential difference is impressed across the transducer 80 with the first surface electrode 20 at a lower potential than the second surface electrode 22, the transducer 80 distorts into a second bending state as shown. The word bending includes elongation, contraction, shear, or combinations thereof. It is important to note that the piezoelectric transducer 80 requires only one functionally gradient piezoelectric element 60 as compared to two or more elements for the prior art bimorph transducer (not shown).

Referring again to FIGS. 1 and 2, a source of power 240 having first and second terminals 250, 260 connected, respectively, to the first and second surface electrodes 20 and 22 of the piezoelectric transducer 80 enables fluid flow through the fluid containment chamber 120. Thus, on the one hand, when the piezoelectric transducer 80 is energized to pump fluid out of the fluid containment chamber 120, the source of power 240 provides a positive voltage to the first terminal 250 and a negative voltage to the second terminal 260. On the other hand, when the piezoelectric transducer 80 is energized to pump fluid into the fluid containment chamber 120, the source of power 240 provides a negative voltage to the first terminal 250 and a positive voltage to the second terminal 260.

In operation, the piezoelectric pumping apparatus 100 of the invention performs in the manner described below. When the power source 240 connected to the transducer 80 is off, i.e. there is no voltage on either the first or second terminals 250 and 260, the pump is inactive. To pump fluid out of the fluid containment chamber 120, the power source 240 provides a positive voltage to first terminal 250 and a negative voltage to second terminal 260. Thus, the first surface electrode 20 is at a higher potential than the second surface electrode 22. This creates an electric field through the functionally gradient piezoelectric element 60 causing it to expand in length parallel to the first and second surface electrodes 20 and 22, as discussed above. Since the functional dependence of the piezoelectric coefficient $d_{31}(z)$ increases with (z) as shown in FIG. 4, the lateral expansion of the functionally gradient piezoelectric element 60 decreases in magnitude from the first surface electrode 20 to the second electrode 22, thereby causing the functionally gradient transducer 80 to deform into a first bending state as shown in FIG. 7. Thus, the top surface 124 of compliant member 122 takes the shape of dotted line 270 thereby reducing the volume of fluid containment chamber 120. This, in turn, increases the pressure of the fluid in the fluid containment chamber 120 so that it is greater than that at the exterior part 200 of the outlet port 160. Under this condition the second valve 140 permits fluid to flow out of the fluid containment chamber 120 through the outlet port 160 as indicated by flow arrow 190, as is well known. The compliant member 122 is preferably made from plastic, such as nylon, and functions to insulate the transducer 80 from the fluid in the fluid containment chamber 120.

To draw fluid into the fluid containment chamber 120, the power source 240 provides a negative voltage to terminal 250 and a positive voltage to terminal 260. Thus, the first surface electrode 20 is at a lower potential than the second surface electrode 22. Similarly, this potential difference creates an electric field through the functionally gradient piezoelectric element 60 causing it to contract in length parallel to the first and second surface electrodes 20 and 22 as discussed above. Since the functional dependence of the piezoelectric coefficient $d_{31}(z)$ increases with (z) as shown in FIG. 4, the lateral contraction of the functionally gradient piezoelectric element 60 decreases in magnitude from the first surface electrode 20 to the second surface electrode 22, thereby causing the functionally gradient transducer 80 to deform into a second bending state as shown in FIG. 8. Thus, the bottom surface 126 of compliant member 122 takes the shape of dotted line 280 thereby reducing the volume of fluid containment chamber 120. This, in turn, decreases the pressure of the fluid in the fluid containment chamber 120 so that it is less than that at the exterior part 180 of the inlet port 150. Under this condition the first valve 130 permits fluid to flow into the fluid containment chamber 120 through the inlet port 150 as indicated by flow arrow 170, as is well known.

The outflow/inflow operation described above is depicted by the bi-directional arrow 290 which shows the range of motion of the compliant member 122 with enclosed functionally gradient piezoelectric transducer 80.

Therefore, the invention has been described with reference to a preferred embodiment. However, it will be appreciated that variations and modifications can be effected by a person of ordinary skill in the art without departing from the scope of the invention.

Parts List 20 first surface electrode
22 second surface electrode
24 wire
26 wire
30 switch
40 voltage source
60 functionally gradient piezoelectric element
62 first surface
64 second surface
70 polarization vector
80 piezoelectric transducer
100 piezoelectric pumping apparatus
110 pump body
120 fluid containment chamber
122 compliant member
124 top surface of compliant member
126 bottom surface of compliant member
130 first valve
140 second valve
150 inlet port
160 outlet port
164 reservoir
166 outflow port
168 fluid conduit
170 flow arrow
180 exterior part of the inlet port
190 flow arrow
200 exterior part of the outlet port
240 power source
250 first terminal
260 second terminal
270 dotted line
280 dotted line
290 bi-directional arrow

What is claimed is:

1. Method of controlling fluid flow in a microfluidic process, comprising the steps of:

(a) providing a piezoelectric pump in fluid communication with the microfluidic process, said piezoelectric pump comprises a pump body having a fluid containment chamber, and inlet and outlet ports in fluid communication with the fluid containment chamber, said inlet and outlet ports have, respectively, a first valve and a second valve for controlling fluids passing therethrough and through the microfluidic process, said piezoelectric transducer arranged in said pump body, said piezoelectric transducer comprising a functionally gradient piezoelectric element having opposed first and second surfaces and a first electrode fixedly arranged on said first surface and a second electrode fixedly arranged on said second surface said functionally gradient piezoelectric element being formed of piezoelectric material having a functionally gradient d-coefficient formed from sequential coating layers of piezoelectric material selected so that the functionally gradient piezoelectric element bends in response to an applied voltage to said first and second electrodes which produces an electric field in the functionally gradient piezoelectric element; and (b) applying a voltage to said first and second electrodes of said functionally gradient piezoelectric element enabling fluid flow into and out said microfluidic process, wherein said piezoelectric transducer is energized to pump fluid out of said microfluidic process when said source of power provides a positive voltage to said first terminal and a negative voltage to said second terminal, and wherein said piezoelectric transducer is energized to pump fluid into said microfluidic process when said source of power provides a negative voltage to said first terminal and a positive voltage to said second terminal.

2. The method recited in claim 1 further including the step of providing a functionally gradient piezoelectric element comprised of a piezoelectric material selected from the group consisting of PZT, PLZT, $LiNbO_3$, $KnbO_3$, $BaTiO_3$ and a mixture thereof.

3. The method recited in claim 1 further including the step of providing a functionally gradient piezoelectric element comprising a piezoelectric material including PZT.

4. The method recited in claim 1 further including the step of polarizing the functionally gradient piezoelectric element in a direction perpendicular to the first and second surfaces, wherein the functionally gradient d-coefficient varies perpendicularly to the first and second surfaces and the first and second electrodes are disposed over the first and second surfaces.

* * * * *